United States Patent
Seddon et al.

(10) Patent No.: US 7,170,444 B1
(45) Date of Patent: Jan. 30, 2007

(54) NON-LINEAR DISPERSIVE PULSE GENERATOR

(75) Inventors: Nigel Seddon, Bristol (GB); Christopher R. Spikings, Bristol (GB)

(73) Assignee: Bae Systems plc, Farnborough (GB)

(*) Notice: Subject to any disclaimer, the term of this patent is extended or adjusted under 35 U.S.C. 154(b) by 1826 days.

(21) Appl. No.: 09/184,401

(22) Filed: Nov. 3, 1998

(30) Foreign Application Priority Data

Nov. 3, 1997 (GB) ................................. 9723196.3

(51) Int. Cl.
*G01S 7/282* (2006.01)

(52) U.S. Cl. .................. 342/202; 342/13; 342/14; 342/175

(58) Field of Classification Search ............... 342/13, 342/14, 175, 200–204
See application file for complete search history.

(56) References Cited

U.S. PATENT DOCUMENTS

| | | | | | |
|---|---|---|---|---|---|
| 3,297,875 | A | * | 1/1967 | Garwin et al. | 398/88 |
| 3,407,309 | A | * | 10/1968 | Miller | 359/328 |
| 3,602,724 | A | * | 8/1971 | Smith | 372/22 |
| 3,665,206 | A | * | 5/1972 | Bergman et al. | 359/328 |
| 4,731,787 | A | * | 3/1988 | Fan et al. | 372/22 |
| 5,157,272 | A | * | 10/1992 | Seddon | 307/106 |
| 5,591,981 | A | * | 1/1997 | Heffelfinger et al. | 250/458.1 |
| 5,923,227 | A | * | 7/1999 | Seddon | 333/23 |
| 6,091,356 | A | * | 7/2000 | Sanders et al. | 342/132 |
| 6,114,986 | A | * | 9/2000 | Cassen et al. | 342/175 |
| 6,420,992 | B1 | * | 7/2002 | Richmond | 342/14 |
| 6,429,800 | B1 | * | 8/2002 | Richmond | 342/14 |
| 6,870,498 | B1 | * | 3/2005 | Morgan et al. | 342/14 |

FOREIGN PATENT DOCUMENTS

| | | | |
|---|---|---|---|
| EP | 905887 A2 | * | 3/1999 |
| GB | 2368213 A | * | 4/2002 |
| WO | WO 2004025783 A1 | * | 3/2004 |

OTHER PUBLICATIONS

"Soliton cloning in a dispersive nonlinear medium coherently driven", Caetano, D.P.; Cavalcanti, S.B.; de Souza, R.F.; Hickmann, J.M. Nonlinear Optics '98: Materials, Fundamentals and Applications Topical Meeting Aug. 10-14, 1998 pp. 119-121.*

* cited by examiner

*Primary Examiner*—John B. Sotomayor
(74) *Attorney, Agent, or Firm*—Nixon & Vanderhye P.C.

(57) ABSTRACT

A non-linear dispersive pulse generator for producing pulsed radio frequency electrical signals includes a non-linear dispersive electrical circuit (1) incorporating at least one non-linear element (2) made of a material sensitive to low power signals and a means (5) of producing a variable power control signal (6) and applying it to the element (2) to modify the extent of the non linearity of the element (2) and thereby vary the output frequency of the radio frequency electrical signal generated by the generator.

5 Claims, 1 Drawing Sheet

NON-LINEAR DISPERSIVE PULSE GENERATOR

FIELD OF THE INVENTION

This invention relates to a non-linear dispersive pulse generator for producing pulsed radio frequency electric signals.

BACKGROUND OF THE INVENTION

High power radio frequency and microwave generators are known and it is desirable with such generators to be able to provide a facility for quickly changing the frequency of the output radio frequency signal. Such generators are required to produce high power pulses of radio frequency with peak powers, for example, in excess of 100 kW. For convenience the term radio frequency as used in this specification is intended to mean radiation in the high frequency, very high frequency, ultra high frequency and microwave regions of the electromagnetic spectrum.

It is desirable to be able to adjust the output frequency of a high power radio frequency generator rapidly and over a relatively large tuning range. For example it is useful to be able to adjust the frequency of the output signal in a time of the order of 0.1 millisecond to 1 millisecond, which allows frequency variation at pulse repetition frequencies of 1 kHz to 10 kHz.

Examples of known high power radio frequency generators are magnetrons, klystrons and travelling wave tubes (TWTs). These devices generally operate by generating a beam of electrons which passes through a periodic mechanical structure designed such that the electron beam interacts with the mechanical structure so that energy is extracted from the electron beam to produce a radio frequency or microwave field inside the mechanical structure which is normally a cavity. The characteristics of the radio frequency output from such known devices are fixed partly by the design of the mechanical structure and the characteristics of the electron beam and the structure together determine the range of radio frequency oscillation frequencies which can be supported and the quality factor of the cavity. Such devices may act as amplifiers for a small radio frequency signal.

High power oscillators such as magnetrons have been developed to produce output powers up to a few megawatts with tuning ranges of about 10 percent. The radio frequency output of such magnetrons is tuned by mechanical adjustment of the cavity and very high power magnetrons usually have relatively small tuning ranges. Specialised magnetrons which include rapidly rotating disks are able rapidly to adjust the radio frequency output frequency from pulse to pulse but are limited to relatively low output powers of less than 1 megawatt with constrained frequency agility resulting from fixed cycling patterns.

Klystron amplifiers may be used to produce high radio frequency output powers with the frequency being tuneable by variation of the frequency of the low power radio frequency input signal. As the peak power of a klystron is increased the band width is reduced and the effective tuning range is reduced accordingly.

Travelling Wave Tube amplifiers have been developed with band widths of one octave but this restricts the operating power to relatively low values of typically less than 100 kW. At higher power levels the band width is reduced to about 10 to 15% at 1 megawatt power.

Thus at power levels of more than a few megawatts conventional electron beam radio frequency generators have small band widths and small tuning ranges. High power magnetrons require mechanical adjustments to the cavity to adjust the radio frequency output frequency. Amplifiers such as klystrons and TWTs have severely restricted band widths at high power levels with correspondingly reduced frequency change agility.

OBJECTS OF THE INVENTION

Thus one object of the present invention is to provide a radio frequency generator which can be operated at relatively high power levels, preferably up to 1 gigawatt with a good ability for frequency change.

This and other objects and advantages of the present invention will become more apparent from details disclosed in the following specification where preferred embodiments of the invention are described.

SUMMARY OF THE INVENTION

According to one aspect of the present invention there is provided a non-linear dispersive pulse generator for producing pulse radio frequency electrical signals, including a non-linear dispersive electrical circuit incorporating at least one non-linear element made of a material sensitive to low power signals and a means of producing a variable power control signal and applying the control signal to the at least one non-linear element to modify the extent of the non-linearity of the element and thereby vary the output frequency of the radio frequency electrical signal generated.

Preferably the non-linear dispersive electrical circuits includes a plurality of non-linear elements in the form of inductors interconnected in series, a first array of coupling capacitors each linking the input side of one inductor to the output side of the next inductor in line for dispersive purposes, and a second array of capacitors arranged in parallel to one another such that each capacitor of the second array connects the input side of a different inductor to a common electrical line.

Conveniently the or each non-linear element material is a ferromagnetic material sensitive to a magnetic field and the control signal producing means is operable to produce a relatively small variable electric current which gives rise to a variable low value magnetic field which is applied to the ferromagnetic material to adjust the initial state of the non-linear element and alter the behaviour of the non-linear element during modulation of a high power radio signal to change the frequency of the radio frequency signal outputted from the generator.

Advantageously the control signal producing means includes a source of low power direct current which is applied to the input side of the non-linear dispersive electrical circuit with a high voltage input and which is returned to the source from the output side of the non-linear dispersive electrical circuit at the radio frequency signal output, and a computer control for varying the value of the low power direct current to vary the frequency of the radio frequency output signal.

Alternatively the or each non-linear element material is ferroelectric material sensitive to an electric field and the control signal producing means is operable to produce a variable low value electric field which is applied to the ferroelectric material to adjust the initial state of the non-linear element and alter the behaviour of the non-linear element during modulation of a high power radio frequency signal to change the frequency of the radio frequency signal outputted from the generator.

For a better understanding of the present invention, and to show how the same may be carried into effect, reference will now be made, by way of example, to the accompanying drawing in which:

DESCRIPTION OF EMBODIMENTS OF THE INVENTION

Figure 1:
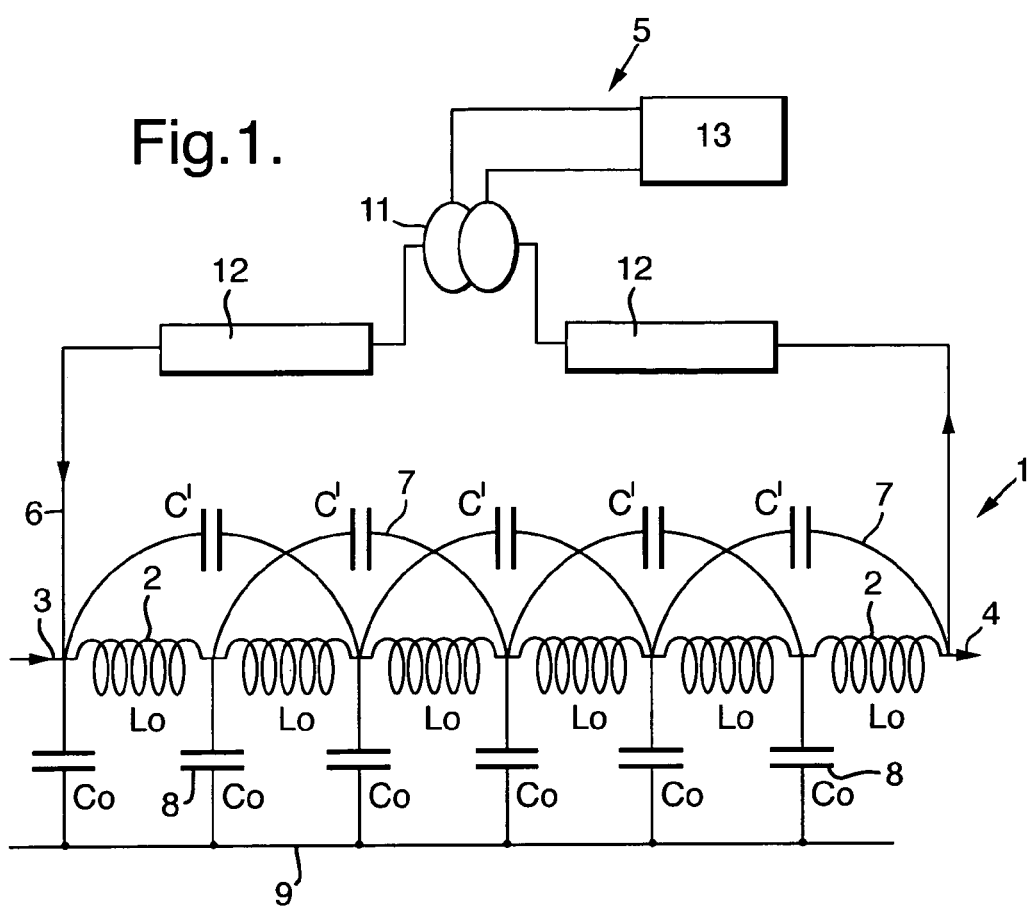
FIG. 1 is a schematic diagram of a non-linear dispersive pulse generator according to a first embodiment of the present invention.

A non-linear dispersive pulse generator according to a first embodiment of the present invention is shown in FIG. 1 and is operable to produce pulsed radio frequency electrical signals. To this end it employs a non-linear dispersive electrical circuit generally indicated at 1 incorporating at least one non-linear element such as inductors 2 made of a material sensitive to low power signals. A high voltage electrical pulse that has a short pulse rise time and a flat top is injected into the circuit 1 at 3. The non-linear and dispersive characteristics of the circuit 1 modify the shape of the pulse and are such as to produce a radio frequency output pulse at 4 from the input pulse. Preferably the circuit 1 is solid state.

The pulse generator as shown in FIG. 1 also includes a means generally shown at 5 for producing a variable power control signal 6 and for applying the signal 6 to at least one of the non-linear elements such as the inductors 2 at the high voltage input point 3 to modify the extent of the non-linearity of the element and thereby vary the output frequency of the radio frequency electrical signal 4 generated.

The circuit 1 includes a plurality of the non-linear elements in the form of inductors 2 interconnected in series, a first array of coupling capacitors 7 each linking the input side of one inductor 2 to the output side of the next inductor 2 in line for dispersive purposes. These capacitors 7 have a value C" and provide additional dispersive characteristics to the circuit 1 in order to enhance the conversion of energy from the input pulse at 3 to the radio frequency output signal at 4. The arrangement of the coupling capacitors 7 as shown in FIG. 1 is merely one example and suitable dispersive properties may be provided in the circuit 1 by other arrangements of capacitors or additional inductor elements. It is also stressed that although the input pulses at 3 usually has a short pulse rise time and a flat top, neither of these aspects are essential. It should also be noted that in FIG. 1 the circuit 1 has 6 sections but more or less sections can be provided if desired.

Also forming part of the circuit 1 is a second array of capacitors 8 each having a capacitance $T_0$ arranged in parallel to one another such that each capacitor 8 connects the input side of a different inductor 2 to a common electrical line 9. Each inductor 2 has an inductance $L_0$.

The input pulse injected at point 3 is a high voltage pulse for example 50 kV. The current associated with this pulse is also of a high value for example 2 kA. The high current pulse propagates from left to right in FIG. 1 with the propagation velocity being determined partly by the inductance value $L_0$ of the inductors 2.

Rapid adjustment of the output frequency from the radio frequency output at 4 over a wide frequency range is achievable with the generator of FIG. 1 by adjusting the extent of non-linearity in the circuit 1. The variation in circuit non-linearity is achieved by choosing a non-linear element such as the inductors 2 made of a material sensitive to low power control signals 6. For example the elements such as the inductor 2 may contain a material which is a ferromagnetic material sensitive to the application of low value magnetic fields or a ferroelectric material sensitive to the application of low value electric fields. The control signal 6 is a relatively small current or a relatively small electric field which is used to adjust the initial state of the non-linear material with this adjustment altering the behaviour of the non-linear elements such as 2 during modulation of a high power radio frequency signal and consequently changing the frequency of the radio frequency output signal. Adjustment of the control signal 6 then allows changes to be made to the radio frequency output frequency at 4 on a pulsed pulse basis.

Thus in the embodiment of FIG. 1 the non-linear element material is a ferromagnetic material sensitive to a magnetic field. The ferromagnetic material is a saturable magnetic material and the inductors 2 preferably are formed from a conductive wire which is threaded with soft, saturable, ferrite magnetic beads (not shown). In this case the magnetic field which is associated with the input pulse current at point 3, (usually approximately 2 kA) is applied to the ferrite toroid in a circumferential direction. When the magnetic material is in an unsaturated state its presence increases the value of each circuit inductance to a value greater than $L_0$. If the magnetic material is forced into a saturated state the value of the inductance falls to the lower limiting value of $L_0$. Thus when the control signal 6 is a relatively small variable electric current a variable low value magnetic field is created at the inductors 2 so as to adjust the initial state of the non-linear element 2 and alter the behaviour of the element 2 during modulation of a high power radio frequency signal to change the frequency of the radio frequency signal outputted at point 4.

The non-linear magnetic material which is included in the inductor 2 may be used to effect the propagation of the input pulse through the circuit 1. The presence of unsaturated magnetic material in each of the circuit inductances inhibits the flow of current along the transmission line in the circuit 1 such that the propagation velocity of the front of the input pulse is reduced by the presence of unsaturated magnetic material. Consequently the injected current pulse propagates from the input .3 to the output point 4 at a velocity which is determined partly by the initial state of the non-linear circuit element or inductor 2.

Figure 2:
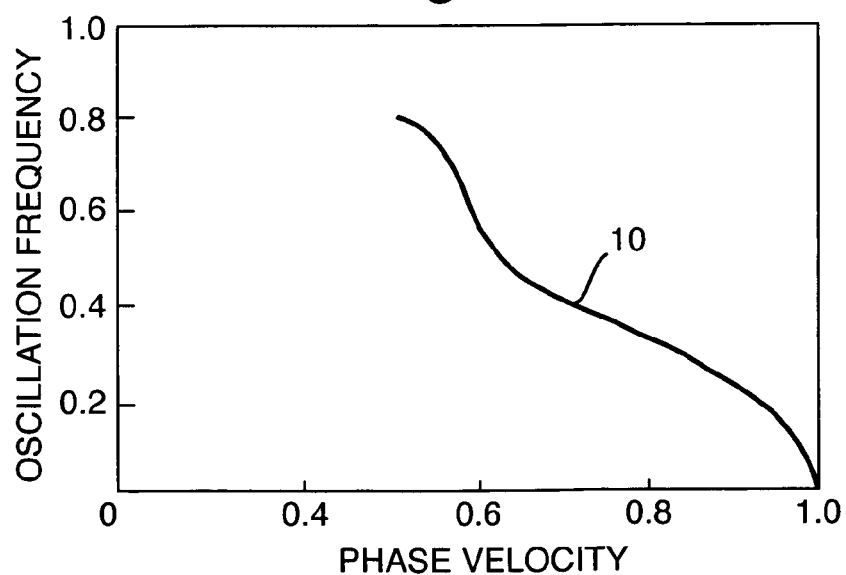
FIG. 2 is a schematic diagram of a typical dispersion curve of a non-linear dispersive electrical circuit used in the embodiment of FIG. 1.

The dispersive characteristics of the circuit 1 produce the natural effect that the phase velocity of an oscillating signal is dependent on the oscillation frequency of the signal. FIG. 2 shows a typical dispersion curve for a circuit such as that shown in FIG. 1 in which it is clear that the phase velocity of an oscillatory signal in the circuit 1 is dependent on the oscillation frequency of the signal. If an electrical pulse with a flat top is injected into circuit 1 at point 3, energy is transferred into an oscillating signal component whose oscillation frequency is determined by a curve such as that shown at 10 in FIG. 2. Each value of phase velocity has a corresponding value of oscillation frequency. The effect of changing the propagation velocity of the injected pulse in the generator of FIG. 1 will be to change the frequency of the radio frequency signal which is excited in the circuit 1. By providing means 5 to adjust the initial condition of the non-linear element or inductor 2 it is possible to control the propagation velocity of the input pulse and consequently control the frequency of the radio frequency output at point 4. In the case of non-linearity which is based on saturable magnetic material, the initial state of the magnetic material can be adjusted by passing a small direct current typically less than 1 amp current through the inductors 2. Injection of the direction current current as a control signal 6 prior to injection of the high current pulse at point 3 will set the condition of the non-linear element or inductor 2 such that the circuit 1 will produce a particular radio frequency output frequency. Variation of the direct current level of control signal 6 will allow variation of the radio frequency output frequency.

As shown in FIG. 1 the means 5 includes a source 11 of low power direct current which is applied to the input side of the non-linear dispersive electrical circuit 1 at point 3 and which is returned to the source from the output side at point 4. Thus the direct current flows through each of the transmission line inductors 2. Passage of the direct current through the inductors 2 produces a magnetic field around each inductor which couples with the saturable magnetic material in each inductor. The direct current control signals 6 can be used to set the initial condition of the saturable magnetic material in each inductor 2 and in effect is used to set the saturable magnetic material at a certain point on its hysteresis loop. The initial set position can be varied continuously between positive and negative saturation values for the saturable magnetic material by selecting the level of direct current appropriately. The means 5 also includes circuit protection elements 12 to protect the source 11 from the high voltage pulse which also is injected at point 3 to the circuit 1.

Adjustment of the direct current signal 6 can be achieved in a short time and for example in the generator of FIG. 1 the output frequency may be changed in less than 1 millisecond. The means 5 also includes a computer control 13 and the frequency of the radio frequency output pulse can be stepping, in a linear fashion, from pulse to pulse through the full tuning range of the generator. It is also possible to produce random radio frequency frequencies from pulse to pulse within the constraints of the radio frequency source tuning range or to produce statistically weighted radio frequency outputs to optimise the energy which is radiated as a function of frequency.

The tuning range of radio frequency frequencies which can be generated from a generator as shown in FIG. 1 can be at least plus or minus 20% of the design centre frequency. This is a large range compared to conventional high power radio frequency generators. Preferably the non-linear dispersive circuit 1 should be designed to give a large variation in oscillation frequency for a small variation in phase velocity.

Various modifications and alterations may be made to the embodiments of the present invention described and illustrated, within the scope of the present invention as defined in the following claims.

What is claimed is:

1. A non-linear dispersive pulse generator for producing pulsed radio frequency electrical signals, including a non-linear dispersive electrical circuit incorporating at least one non-linear element made of a material sensitive to low power signals, and a means of producing a variable power control signal and applying the control signal to the at least one non-linear element to modify the extent of the non-linearity of the element and thereby vary the output frequency of the radio frequency electrical signal generated.

2. A generator according to claim 1, wherein the non-linear dispersive electrical circuit includes a plurality of non linear elements in the form of inductors interconnected in series, a first array of coupling capacitors each linking the input side of one inductor to the output side of the next inductor in line for dispersive purposes, and a second array of capacitors arranged in parallel to one another such that each capacitor of the second array connects the input side of a different inductor to a common electrical line.

3. A generator according to claim 2, wherein the or each non-linear element material is a ferromagnetic material sensitive to a magnetic field and wherein the control signal producing means is operable to produce a relatively small variable electric current which gives rise to a variable low value magnetic field which is applied to the ferromagnetic material to adjust the initial state of the non-linear element and alter the behaviour of the non-linear element during modulation of a high power radio frequency signal to change the frequency of the radio frequency signal outputted from the generator.

4. A generator according to claim 3, wherein the control signal producing means includes a source of low power direct current which is applied to the input side of the non-linear dispersive electrical circuit with a high voltage input and which is returned to the source from the output side of the non-linear dispersive electrical circuit at the radio frequency signal output, and a computer control for varying the value of the low power direct current to vary the frequency of the radio frequency output signal.

5. A generator according to claim 1, wherein the or each non-linear element material is ferroelectric material sensitive to an electric field and wherein the control signal producing means is operable to produce a variable low value electric field which is applied to the ferroelectric material to adjust the initial state of the non-linear element and alter the behaviour of the non-linear element during modulation of a high power radio frequency signal to change the frequency of the radio frequency signal outputted from the generator.

* * * * *